United States Patent [19]

Crescenzi et al.

[11] Patent Number: 4,477,952

[45] Date of Patent: Oct. 23, 1984

[54] PIEZOELECTRIC CRYSTAL ELECTRODES AND METHOD OF MANUFACTURE

[75] Inventors: Robert J. Crescenzi, Forest; John U. Daniels, Jr.; Gerald E. Roberts, both of Lynchburg, all of Va.

[73] Assignee: General Electric Company, Lynchburg, Va.

[21] Appl. No.: 481,834

[22] Filed: Apr. 4, 1983

[51] Int. Cl.³ .............................................. H01L 41/10
[52] U.S. Cl. .................................. 29/25.35; 427/100;
427/124; 427/250; 427/255; 427/255.7;
427/404; 428/621; 428/652; 428/673; 428/680;
310/312; 310/364; 204/38 B; 204/385
[58] Field of Search ............... 427/100, 124, 250, 255,
427/255.7, 404; 428/621, 652, 673, 680;
310/312, 364; 29/25.35; 204/38 B, 385

[56] References Cited

U.S. PATENT DOCUMENTS

| 2,445,310 | 7/1948 | Chilowsky | 427/100 |
| 2,497,666 | 2/1950 | Gravley | 427/100 |
| 3,252,722 | 5/1966 | Allen | 428/652 |
| 3,886,585 | 5/1975 | Konantz et al. | 428/652 |
| 4,259,607 | 3/1981 | Noguchi et al. | 310/364 |

OTHER PUBLICATIONS

Rennick, IEEE Transactions on Sonics and Ultrasonics, vol. SU-20, No. 4, Oct. 1973, pp. 347-354.

Primary Examiner—Norman Morgenstern
Assistant Examiner—Richard Bueker
Attorney, Agent, or Firm—James J. Williams

[57] ABSTRACT

An improved crystal is provided with an aluminum baseplate, a nickel plating on the aluminum baseplate, and a silver plating on the nickel plating. The nickel is plated on the aluminum baseplate before the aluminum has oxidized to provide high yields of stable crystals.

3 Claims, 2 Drawing Figures

PIEZOELECTRIC CRYSTAL ELECTRODES AND METHOD OF MANUFACTURE

BACKGROUND OF THE INVENTION

Our invention relates to piezoelectric crystals, and particularly to improved electrodes for piezoelectric crystals and a method of manufacturing such improved electrodes.

Piezoelectric crystals for radio and electronic circuits require electrodes for connection to the circuits. Such electrodes are provided by an initial evaporation of a high purity metal, such as gold, silver or aluminum, on each crystal after it has been lapped and etched to an appropriate unelectroded frequency. This initial metal evaporation is called baseplating. The areas of metal supplied by the evaporation are determined by precision photo-etched masks which define the resonator and conductor patterns on each face of the crystal plate or blank. The crystal blank is held in place by a fixture located in a chamber. The fixture and the crystal blank are sandwiched between the photoetched masks which define the correct electrode pattern on each face of the crystal blank. A typical baseplate mask may accommodate an array of 20 to 40 crystals. A container of the baseplate metal is also placed in the chamber. The chamber is then sealed, partially evacuated, and vented or purged with an atmosphere of dry nitrogen to dispel contaminants and impurities. After this, the chamber is pumped down to leave a high vacuum. The container of baseplate metal is then heated to evaporate the metal on the unmasked crystal surfaces. When the evaporation is complete, the correct resonator and conductor baseplate patterns or electrodes are provided on the appropriate surfaces of the crystal blank in accordance with the mask patterns.

If silver is the metal evaporated to provide the baseplate, the crystal is mounted in a suitable holder following application of the baseplate. Suitable leads are cemented to the baseplate electrodes, using conductive cement. With leads provided, the baseplate is electroplated with nickel to a predetermined frequency based on the final crystal frequency and the frequency limitations of the final frequency adjustment method. As known in the art, the nickel electroplate tends to metallurgically stabilize the silver baseplate electrodes and conductors. The nickel electroplate thus reduces the effects of contamination and aging during the time interval following the electroplating and before the final frequency adjustment. The nickel electroplate also stabilizes frequency shifts which occur during sealing of the crystal in a suitable can, and further reduces effects of aging after the crystal is sealed in the can. In addition, the nickel electroplate serves to adjust the final frequency of the crystal close enough so that conventional automated final frequency adjustments can be made by further evaporating silver through a mask over the nickel electroplate. This mask is usually somewhat smaller than the nickel electroplated surfaces. In the manufacture of coupled-dual crystals, the prior art automated active frequency adjustment is capable of adjusting the final frequencies a relatively small amount. This adjustment is limited because of the limitations of the automated measuring techniques. For example, see the article entitled "An Equivalent Circuit Approach to the Design and Analysis of Monolithic Crystal Filters" by R. C. Rennick; IEEE Trans. on Sonics and Ultrasonics, Vol. SU-20, No. 4, pp. 347–354, Oct. 1973. This plating and measuring process have been used for coupled-dual crystals that operate in the range from about 5 megahertz to 25 or 30 megahertz.

However, in the case of higher frequency coupled-dual crystals, such as in the range of 45 megahertz, third overtone crystals must often be used, particularly in first IF filter applications for radios. At such frequencies, IF bandwidth requirements and impedance level limitations often lead to 45 Megahertz third overtone coupled-dual crystals which require very small mass loading on the crystal plate itself. If gold or silver is used to provide the initial metalization onto the crystal plate, such plating or metalization is often so thin that the crystal will not oscillate. Therefore, we have found that it is highly desirable, if not essential, that a relatively light metal such as aluminum be used to provide the initial baseplate on the crystal. In such a case, the crystal resonators are adjusted to final frequency by evaporating a metal such as silver or gold through a mask whose opening has an area smaller than the resonator electrode to be adjusted to provide a fairly small area. However, this arrangement produces a crystal which needs or requires a relatively large termination resistance when used in a filter application. Although such a crystal is acceptable for some applications, such a requirement can cause radiation and matching problems in a radio receiver.

Where the bandwidth required of a crystal resonator serving as an IF filter increases, as it may in certain radio applications, the terminating impedance becomes even larger, and the spacing between the crystal electrodes becomes impractically or unacceptably small, unless photolithographic techniques are used. Therefore, a fundamental frequency coupled-dual crystal must be used. At the high frequencies, such as 45 megahertz, although the required plateback can be larger, the crystal itself is so thin that only very light platings or mass loadings can be used.

In view of the problems mentioned above, it is frequently desirable to use aluminum to baseplate the crystal, followed by silver to provide a final frequency adjustment. However, this causes the crystal frequency to vary in a very irregular manner after the crystal is sealed in its can or container.

SUMMARY OF THE INVENTION

In accordance with our invention, we have found that a crystal having an aluminum baseplate, followed by an evaporation plating of nickel without exposure of the aluminum to the atmosphere, followed by a nickel electroplating if desired or needed, and finally followed by a silver frequency-adjustment plating provides electrodes that produce a very frequency stable and practical crystal. And, this stability is maintained even after the crystal is sealed in its can or container. This improved crystal electrode and method of manufacture provides a stable crystal and increased crystal yields over prior art crystals in which the aluminum baseplate oxidized so rapidly that it could not be electroplated with nickel.

BRIEF DESCRIPTION OF THE DRAWING

The subject matter which we regard as our invention is particularly pointed out and distinctly claimed in the claims. The structure and operation of our invention, as well as advantages, may be better understood from the following description given in connection with the accompanying drawing, in which:

DESCRIPTION OF THE PREFERRED EMBODIMENT

Figure 1:
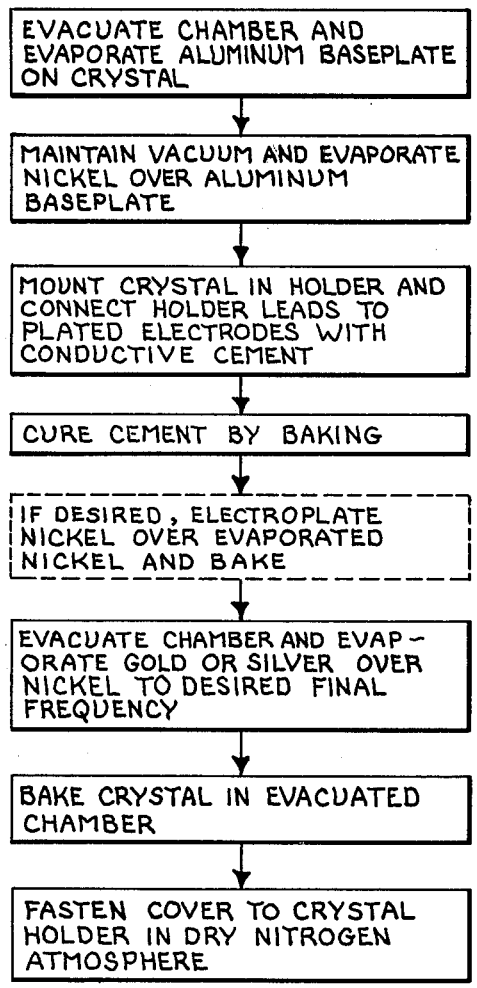
FIG. 1 illustrates a flow diagram of one method of manufacturing crystal electrodes in accordance with our invention.
Figure 2:
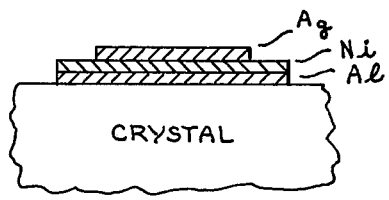
FIG. 2 shows a portion of a crystal with an electrode in accordance with our invention shown in partial cross-section.

With reference to the FIGS. 1 and 2, one or more suitable crystals are ground or lapped to a frequency which, typically, is somewhat higher than the final desired frequency. One or more of these crystals are placed in a suitable fixture, provided with masks, and placed in a suitable first chamber which is provided with one container of aluminum and another container of nickel. The chamber is then sealed and filled or flushed with dry nitrogen to remove as much of the atmosphere and contaminants as possible. The sealed chamber is then evacuated to as high a vacuum as desired or as practical, after which the aluminum is melted so that it evaporates on the unmasked portions of the one or more crystals to provide the baseplate. The baseplate thickness can be controlled by the time allowed for evaporation, this time being determined by prior experiment. Or, this thickness can be controlled by a calibrated monitor crystal whose leads are connected to an outside frequency measurement device usually calibrated to metal thickness.

Next, while the vacuum is maintained, the aluminum is permitted to cool, after which the nickel is melted so that it evaporates over the same unmasked portions of the crystals. This nickel plating is also evaporated to the desired thickness.

The plated crystals are then placed in suitable holders with leads on a base. The base leads are connected to the appropriate crystal electrode conductors by an application of conducting cement. The cement is cured with an appropriate temperature schedule to assure conduction between the electroded conductors of the crystals and the appropriate base leads. Such a schedule might be baking at 95° C. for 1.5 hours followed by 180° C. for 1.5 hours.

For the specific final frequency adjusting scheme, it may be desirable to bring the crystal frequencies closer to its final desired frequencies (see the Rennick article previously mentioned) by adding additional nickel by electroplating. The nickel electroplating may be omitted, as indicated by the dashed line rectangle in the drawing. This nickel electroplating would be followed by an appropriate bake cycle, such as 180° C. for 1.5 hours.

Next, the crystals are mounted in a fixture with the final frequency adjustment masks on the crystals. These masks expose an area on the resonator electrodes usually smaller than the baseplated resonator electrode areas. The second chamber has one or more containers of silver which are heated and silver is evaporated onto the electrodes. The frequencies of the crystal are monitored and the amount of metalization controlled until the desired frequencies are reached. (Again, see the Rennick article.) Usually the metal used in this final frequency adjust step is silver, but it may be gold.

If the crystals have been plated to the desired frequency with silver, they are removed from the second chamber and baked in vacuum, typically in a range from 100° C. to 135° C. for one to four hours. Gold might require a different bake temperature. A cover is placed over the crystal and soldered or welded to the base. We prefer that the crystals be placed in a chamber of dry nitrogen, the covers placed over the crystals in this chamber, and welded to the base while still in this chamber.

After the steps described above and shown in the figure have been completed, the crystals are then ready for use. Such crystals can provide relatively high fundamental operating frequencies, and are very stable, because of the nickel plating metallization evaporated over the aluminum baseplate.

One of the advantages of our invention is that the nickel is evaporated over the aluminum baseplate while the crystals are still in a vacuum, thus preventing the aluminum from oxidizing. After the nickel has been evaporated over the aluminum baseplate, the crystal can be exposed to the atmosphere and placed in another chamber where the silver is evaporated for the final frequency adjustment.

It will thus be seen that we have provided a new and improved plated crystal resonator and a method of manufacturing such platings on the crystal. Our plated crystal and method permit the highly desirable characteristics of nickel to be used over the aluminum baseplate, without the problem of the aluminum baseplate becoming oxidized. In addition, elimination of the aluminum oxide layer provides a finished crystal with numerous measurable improvements. Among those improvements are: crystal aging, frequency stability and crystal resistance. While we have described only one embodiment, persons skilled in the art will appreciate the modifications that may be made to our invention. For example, the various evaporated platings may provide different thicknesses, depending upon the applications for the crystals. Also, the final frequency plating may be done by electroplating. And of course, various baking temperatures and times may be used. Therefore, while our invention has been described with reference to a particular embodiment, it is to be understood that modifications may be made without departing from the spirit of the invention or from the scope of the claims.

What we claim as new and desire to secure by Letters Patent of the United States is:

1. A method for providing electrodes on a piezoelectric crystal comprising:
    a. depositing an aluminum baseplate on said crystal in a relatively high vacuum on at least a portion of a first surface of said crystal;
    b. depositing a nickel plating on said aluminum baseplate before said aluminum baseplate is exposed to an active atmosphere and while said relatively high vacuum is maintained;
    c. removing said crystal, with said aluminum and nickel platings, from said vacuum and connecting leads to said nickel plating;
    d. and depositing a frequency plating selected from silver or gold on said nickel plating in a relatively high vacuum.

2. The method of claim 1, and comprising the further step of curing said leads prior to depositing said frequency plating.

3. The method of claim 1, and comprising the further step of electroplating nickel on said previously deposited nickel plating after connecting said leads and prior to depositing said frequency plating.

* * * * *